(12) United States Patent
Itakura

(10) Patent No.: US 12,124,079 B2
(45) Date of Patent: Oct. 22, 2024

(54) OPTICAL WAVEGUIDE PACKAGE AND LIGHT-EMITTING DEVICE

(71) Applicant: KYOCERA Corporation, Kyoto (JP)

(72) Inventor: Yoshiaki Itakura, Aira (JP)

(73) Assignee: KYOCERA Corporation, Kyoto (JP)

( * ) Notice: Subject to any disclaimer, the term of this patent is extended or adjusted under 35 U.S.C. 154(b) by 184 days.

(21) Appl. No.: 17/770,236

(22) PCT Filed: Oct. 30, 2020

(86) PCT No.: PCT/JP2020/040915
§ 371 (c)(1),
(2) Date: Apr. 19, 2022

(87) PCT Pub. No.: WO2021/085621
PCT Pub. Date: May 6, 2021

(65) Prior Publication Data
US 2022/0373736 A1   Nov. 24, 2022

(30) Foreign Application Priority Data

Oct. 31, 2019 (JP) ................................. 2019-199086

(51) Int. Cl.
*G02B 6/12* (2006.01)

(52) U.S. Cl.
CPC ............. *G02B 6/12004* (2013.01); *G02B 2006/12121* (2013.01); *G02B 2006/12123* (2013.01)

(58) Field of Classification Search
CPC .......... G02B 6/12004; G02B 6/4296; G02B 6/4266; G02B 6/122; G02B 6/4269; G02B 2006/12123; G02B 2006/12135; G02B 2006/12154; H01S 5/02438; H01S 5/02469; H01S 5/4012; H01S 5/4093; H01S 5/0225; H01S 5/026

See application file for complete search history.

(56) References Cited

U.S. PATENT DOCUMENTS

| | | | | |
|---|---|---|---|---|
| 5,802,222 | A * | 9/1998 | Rasch | G02B 26/0808 385/9 |
| 6,112,002 | A | 8/2000 | Tabuchi | |
| 6,468,428 | B1 * | 10/2002 | Nishii | C03C 13/00 210/500.26 |
| 2014/0056028 | A1 * | 2/2014 | Nichol | G02B 6/0015 362/616 |
| 2017/0299823 | A1 | 10/2017 | Tsujita et al. | |
| 2019/0393285 | A1 * | 12/2019 | Kato | H05B 33/10 |
| 2020/0033244 | A1 * | 1/2020 | Boutami | G01N 15/1459 |

FOREIGN PATENT DOCUMENTS

| | | |
|---|---|---|
| JP | 08110446 A * | 4/1996 |
| JP | 09-512353 A | 12/1997 |
| JP | 10-284643 A | 10/1998 |

(Continued)

*Primary Examiner* — Ryan A Lepisto
*Assistant Examiner* — Erin D Chiem
(74) *Attorney, Agent, or Firm* — Volpe Koenig

(57) ABSTRACT

An optical waveguide package includes a substrate having a first surface, and an optical waveguide layer including a cladding located on the first surface and a core located in the cladding. The substrate includes a first portion and a second portion being in contact with the cladding. The second portion bonds to the cladding with a higher bonding strength than the first portion.

10 Claims, 11 Drawing Sheets

(56) References Cited

FOREIGN PATENT DOCUMENTS

| | | | |
|---|---|---|---|
| JP | 2003101044 A | * | 4/2003 |
| JP | 4215764 B2 | | 1/2009 |
| JP | 2011-112973 A | | 6/2011 |
| JP | 2019-105718 A | | 6/2019 |
| WO | 2016/047447 A1 | | 3/2016 |
| WO | 2019/117035 A1 | | 6/2019 |

* cited by examiner

OPTICAL WAVEGUIDE PACKAGE AND LIGHT-EMITTING DEVICE

FIELD

The present disclosure relates to an optical waveguide package and a light-emitting device.

BACKGROUND

A known technique is described in, for example, Patent Literature 1.

CITATION LIST

Patent Literature

Patent Literature 1: Japanese Patent No. 4215764

BRIEF SUMMARY

An optical waveguide package according to an aspect of the present disclosure includes a substrate having a first surface, and an optical waveguide layer including a cladding located on the first surface and a core located in the cladding. The substrate includes a first portion and a second portion being in contact with the cladding. The second portion bonds to the cladding with a higher bonding strength than the first portion.

A light-emitting device according to another aspect of the present disclosure includes the above optical waveguide package, and at least one light-emitting element connected to the optical waveguide package.

BRIEF DESCRIPTION OF DRAWINGS

The objects, features, and advantages of the present disclosure will become more apparent from the following detailed description and the drawings.

DETAILED DESCRIPTION

An optical waveguide package and a light-emitting device including the optical waveguide package described in Patent Literature 1 include a polymer waveguide board including a substrate with a first area having an optical waveguide that is either entirely or mainly a polymer layer and a second area having no optical waveguide. To improve the bond or adhesion between the polymer layer and the substrate, an adhesive layer is formed in each of the first area and the second area on the surface of the substrate.

The adhesive layer in the second area is etched, whereas the adhesive layer in the first area remains unetched. The entire surface of the substrate is then coated with a polymer layer to form an optical waveguide. The polymer layer is cut along a boundary between the first area and the second area. The polymer layer in the second area is separated and removed from the substrate to expose an electrode.

The adhesive layer is formed from any one of a polyimide silicone resin, a fluorine-free polyimide resin, an organic aluminum compound, an organic zirconia compound, and an organic titanium compound, or a combination of these. The structure described in Patent Literature 1 includes the adhesive layer joining the waveguide and the substrate together to reduce separation of the substrate from the waveguide and to allow the substrate to maintain practically sufficient strength of adhesion over a long time.

However, the structure described in Patent Literature 1 includes the adhesive layer that joins the waveguide and the substrate together with a high adhesive strength, and thus does not include a portion to reduce thermal stress caused by emission of light from light-emitting elements. As high thermal stress repeatedly occurs across the optical waveguide and the substrate joined with the adhesive layer, the substrate and the optical waveguide may be separated from each other. Thus, such thermal stress is to be reduced further, and separation of the optical waveguide is to be reduced.

A light-emitting device according to one or more embodiments of the present disclosure will now be described with reference to the accompanying drawings.

First Embodiment

Figure 1:
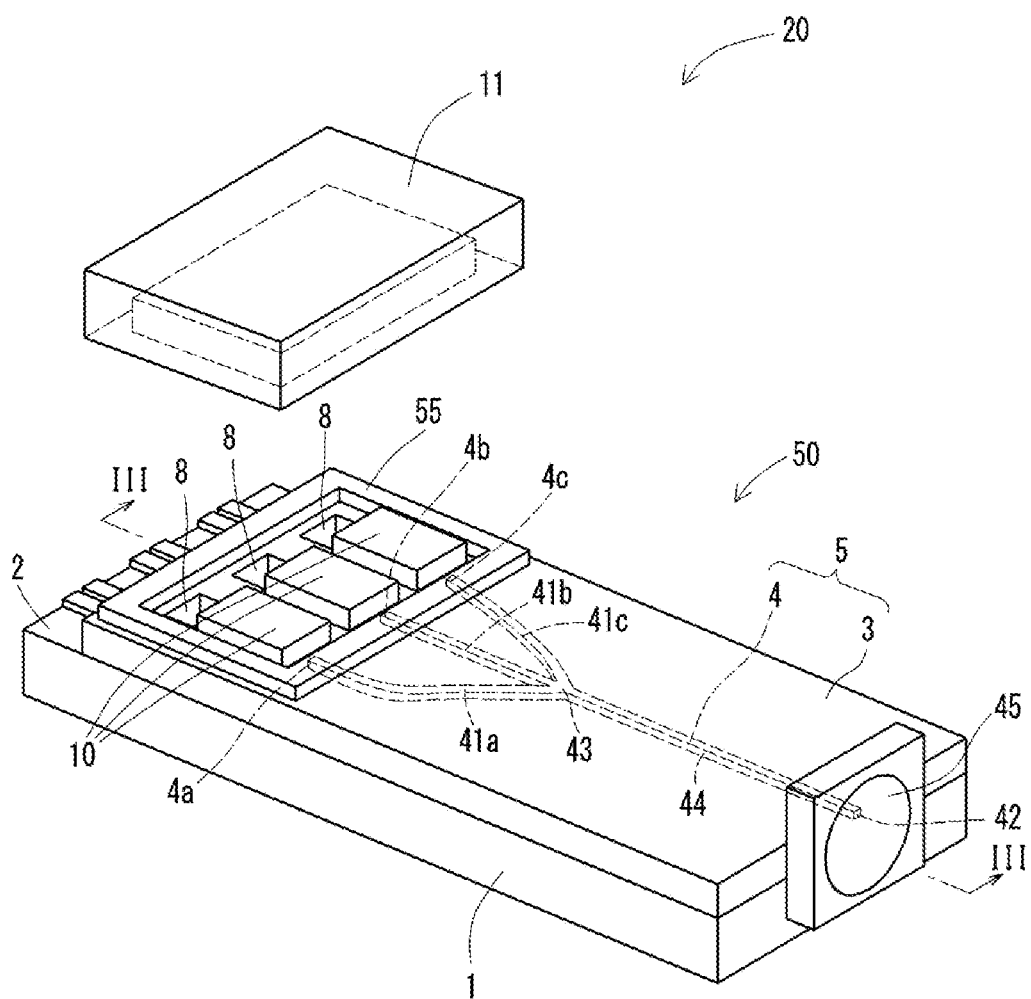
FIG. 1 is an exploded perspective view of a light-emitting device including an optical waveguide package according to a first embodiment of the present disclosure.
Figure 2:
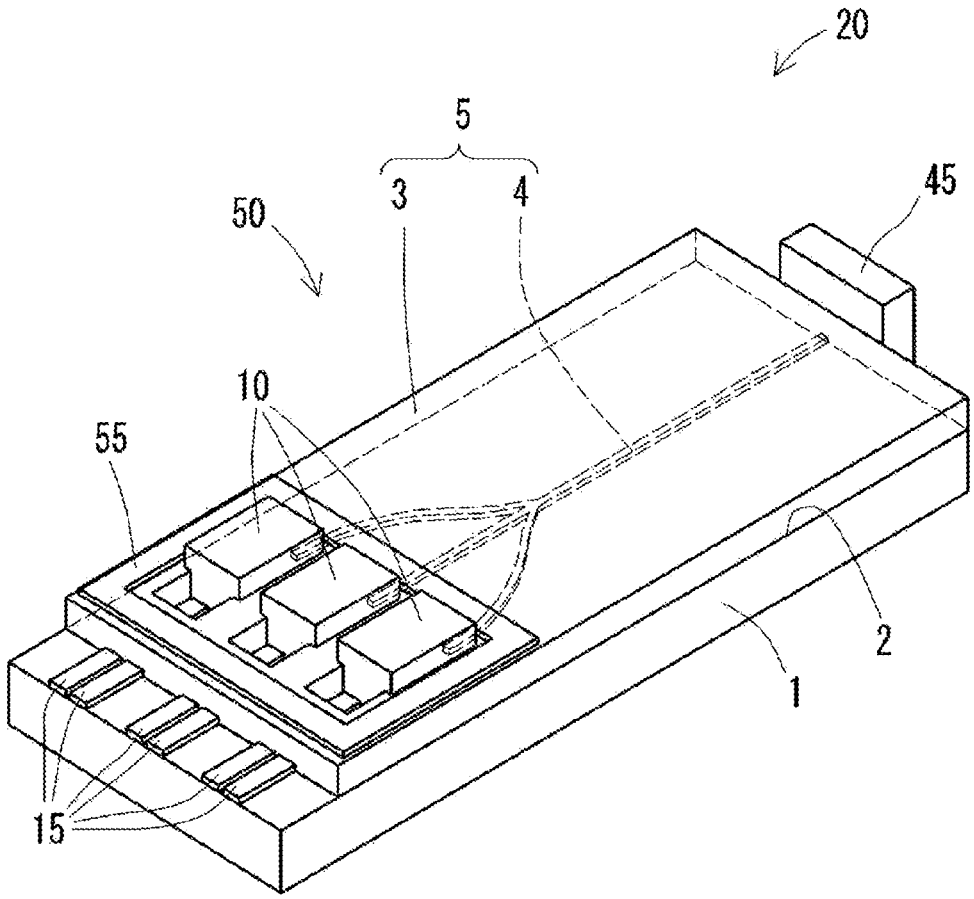
FIG. 2 is a perspective view of the light-emitting device in FIG. 1 without showing a sealing lid.
Figure 3:
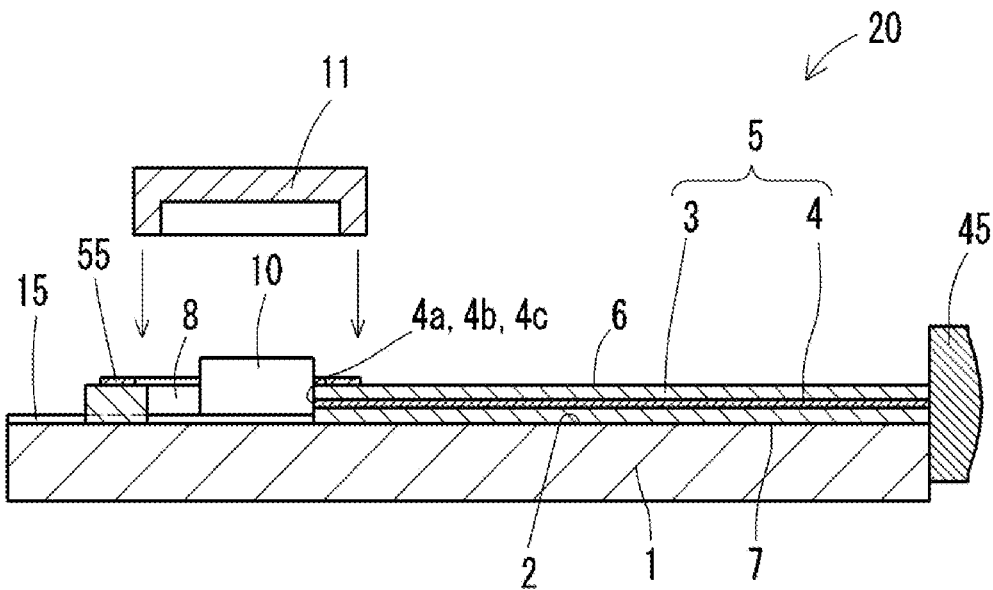
FIG. 3 is a cross-sectional view of the light-emitting device taken along section line in FIG. 1.

FIG. 1 is an exploded perspective view of a light-emitting device including an optical waveguide package according to a first embodiment of the present disclosure. FIG. 2 is a perspective view of the light-emitting device in FIG. 1 without showing a sealing lid. FIG. 3 is a cross-sectional view of the light-emitting device taken along section line in FIG. 1.

An optical waveguide package 50 according to the present embodiment includes a substrate 1 and an optical waveguide layer 5. The optical waveguide layer 5 is on an upper surface 2 of the substrate 1 and includes a cladding 3 and a core 4 in the cladding 3. The cladding 3 has an upper surface 6, a lower surface 7, and a recess 8 extending from the upper surface 6 to the lower surface 7 toward the substrate 1. The upper surface 2 of the substrate 1 faces the recess 8. A sealing lid 11 is placed on the upper surface 6 of the cladding 3 to cover the recess 8. A space for accommodating a light-emitting element 10 is defined between a lower surface 11a of the sealing lid 11 and the upper surface 2 of the substrate 1. The space is defined by inner wall surfaces 13 facing the recess 8 in the cladding 3.

The optical waveguide package 50 according to the present embodiment has multiple (three in the present embodiment) recesses 8 each accommodating a light-emitting element 10. The optical waveguide package 50 and the light-emitting elements 10 form a light-emitting device 20. The light-emitting elements 10 may be laser diodes. The optical waveguide layer 5 includes the core 4 and the cladding 3 integral with each other. The substrate 1 may include multiple dielectric layers stacked on one another. The light-emitting elements 10 may be arranged by passive alignment using image recognition with the markers on the upper surface 2 of the substrate 1.

The substrate 1 may be a ceramic wiring board including dielectric layers formed from a ceramic material. Examples of the ceramic material used for the ceramic wiring board include sintered aluminum oxide, sintered mullite, sintered silicon carbide, sintered aluminum nitride, and sintered glass ceramic. For the substrate 1 being a ceramic wiring board, the dielectric layers include conductors such as connection pads, internal wiring conductors, and external connection terminals for electrical connection between the light-emitting and light-receiving elements and an external circuit.

The substrate 1 may be an organic wiring board including dielectric layers formed from an organic material. The organic wiring board may be a printed wiring board, a build-up wiring board, or a flexible wiring board. Examples of the organic material used for the organic wiring board include an epoxy resin, a polyimide resin, a polyester resin, an acrylic resin, a phenolic resin, and a fluororesin.

The optical waveguide layer 5 may be glass such as quartz, or a resin. The lower surface 11a of the sealing lid 11 and the upper surface 2 of the substrate 1 are joined with a bonding layer 55 of, for example, metal or glass to hermetically seal the recesses 8. The recesses 8 thus have high gas barrier performance to block entry of external gas having a different refractive index, such as air, and foreign matter. The sealing lid 11 may be formed from, for example, the same material as the cladding 3.

In the optical waveguide layer 5, both the core 4 and the cladding 3 may be glass or a resin. In some embodiments, one of the core 4 and the cladding 3 may be glass and the other may be a resin. In the above case, the core 4 has a higher refractive index than the cladding 3. The difference in the refractive index causes total internal reflection of light. More specifically, a material with a higher refractive index is used to form a path, which is then surrounded by a material with a lower refractive index. This structure confines light in the core 4 with the higher refractive index.

The light-emitting device according to the present embodiment includes three light-emitting elements. Each of the light-emitting elements emits laser light with a different color of red (R), green (G), or blue (B). The light-emitting elements are accommodated in the respective recesses 8 and have the same structure on the upper surface 2 of the substrate 1. The structure of one of the three light-emitting elements 10 will now be described. Lower-case letters a, b, and c may not be used as reference numerals for the components corresponding to those described above unless these components are to be differentiated from one another. The core 4 has multiple incident end faces 4a, 4b, and 4c and one emission end face 42. The core 4 defines a merging path including multiple branching paths 41a, 41b, and 41c, a merging portion 43, and a joined path 44 between the incident end faces 4a, 4b, and 4c and the emission end face 42. The branching paths 41a, 41b, and 41c respectively have the incident end faces 4a, 4b, and 4c at one end. The merging portion 43 merges the branching paths 41a, 41b, and 41c together. The joined path 44 has the emission end face 42 at one end.

The device includes multiple condenser lenses 45 for the respective incident end faces 4a, 4b, and 4c. The condenser lenses 45 are located opposite to the respective incident end faces 4a, 4b, and 4c of the core 4. The condenser lenses 45 each have an optical axis aligned with the central axis of the corresponding one of the incident end faces 4a, 4b, and 4c.

Red (R) light, green (G) light, and blue (B) light emitted from the respective light-emitting elements 10 enter the respective branching paths 41a, 41b, and 41c through the incident end faces 4a, 4b, and 4c and pass through the merging portion 43 and the joined path 44 to the condenser lenses 45, through which the light is condensed and emitted.

Each condenser lens 45 is, for example, a plano-convex lens with a flat incident surface and a convex emission surface. The optical waveguide layer 5, the light-emitting elements 10, and the condenser lenses 45 are assembled together to have the branching paths 41a, 41b, and 41c each with its optical axis aligned with the center of the light emitter of the corresponding light-emitting element 10.

Figure 4:
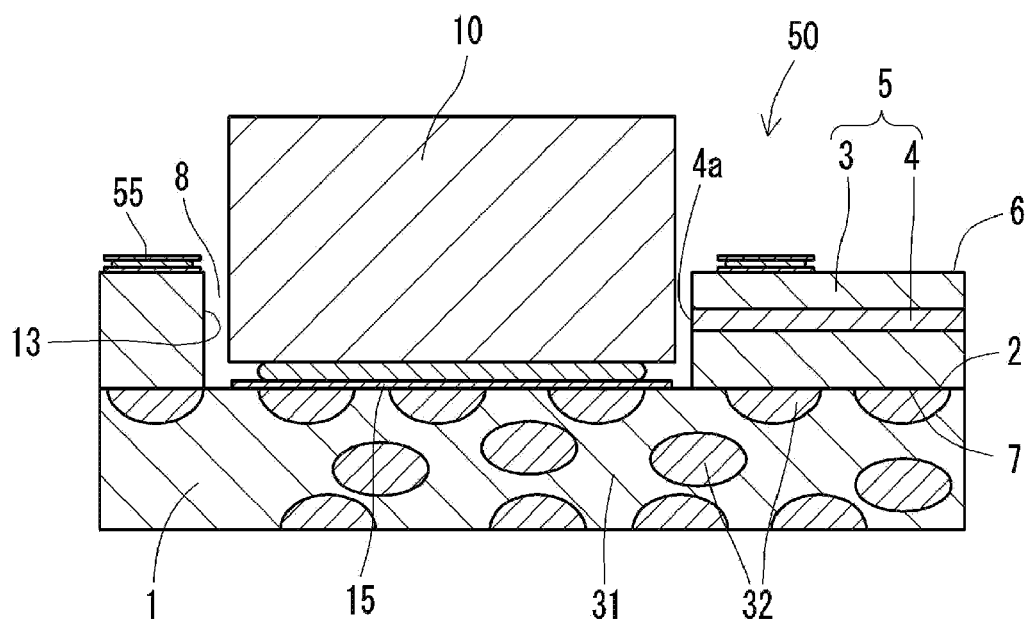
FIG. 4 is a partially enlarged cross-sectional view of the light-emitting device, showing a part adjacent to a recess.
Figure 5:
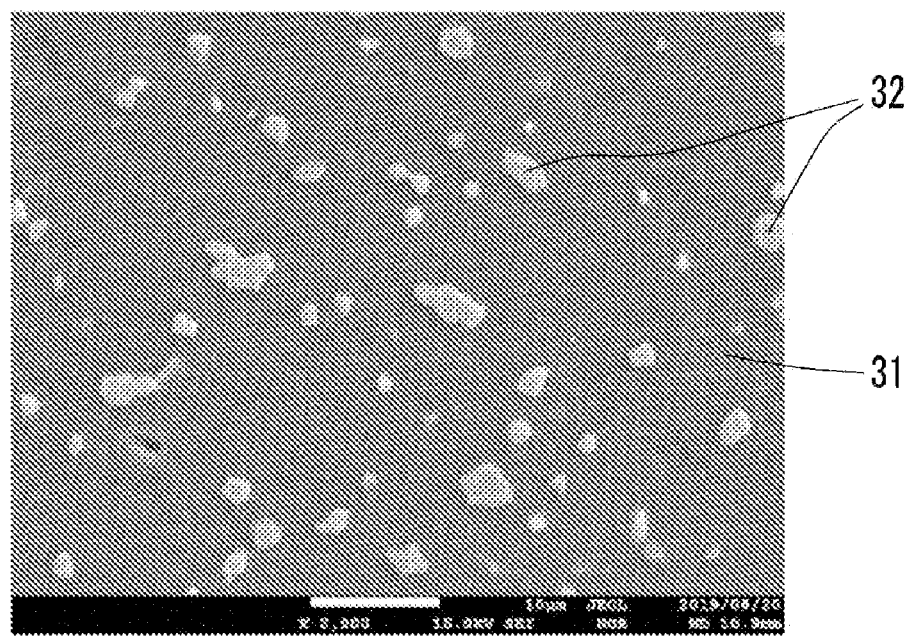
FIG. 5 is an electron micrograph of the surface of a substrate 1.

FIG. 4 is a partially enlarged cross-sectional view of the light-emitting device, showing a part adjacent to a recess. FIG. 5 is an electron micrograph of the surface of the substrate 1. The substrate 1 includes a first portion 31 and a second portion 32. The first portion 31 has the upper surface 2 in contact with the cladding 3. The first portion 31 is a less strongly-bonded area. The second portion 32 is located inside the first portion 31 and has the upper surface 2 exposed from the first portion 31. The exposed part of the second portion 32 is in contact with the cladding 3 and bonds more strongly to the cladding 3 than the first portion 31. The second portion 32 is a strongly-bonded area.

The first portion 31 may be, for example, aluminum nitride (AlN), boron nitride (BN), zirconium carbide (ZrC), diamond (C), or a fluororesin. The second portion 32 may be alumina ($Al_2O_3$), zirconia ($ZrO_2$), magnesia (MgO), titania ($TiO_2$), barium titanate ($BaTiO_3$), quartz glass, silica ($SiO_2$), or a silicone resin. The mixture ratios may be selected as appropriate in accordance with other conditions.

In the substrate 1 including the first portion 31 and the second portion 32, the second portion 32 may bond to another second portion 32 more strongly, and the first portion 31 may bond to the second portion 32 more strongly. This structure is less likely to have lower thermal conductivity caused by, for example, separation due to thermal expansion. The strength of bonding may be evaluated by, for example, pulling the substrate 1 from its lower surface or by pulling the cladding 3 from its upper surface and exposing the interface between the lower surface of the cladding 3 and the upper surface 2 of the substrate 1. The remaining amount or area of the first portion 31 and the second portion 32 with respect to the cladding 3, or the remaining area with respect to the initial bonding area may be used for evaluating the bonding strength.

Second Embodiment

Figure 6A:
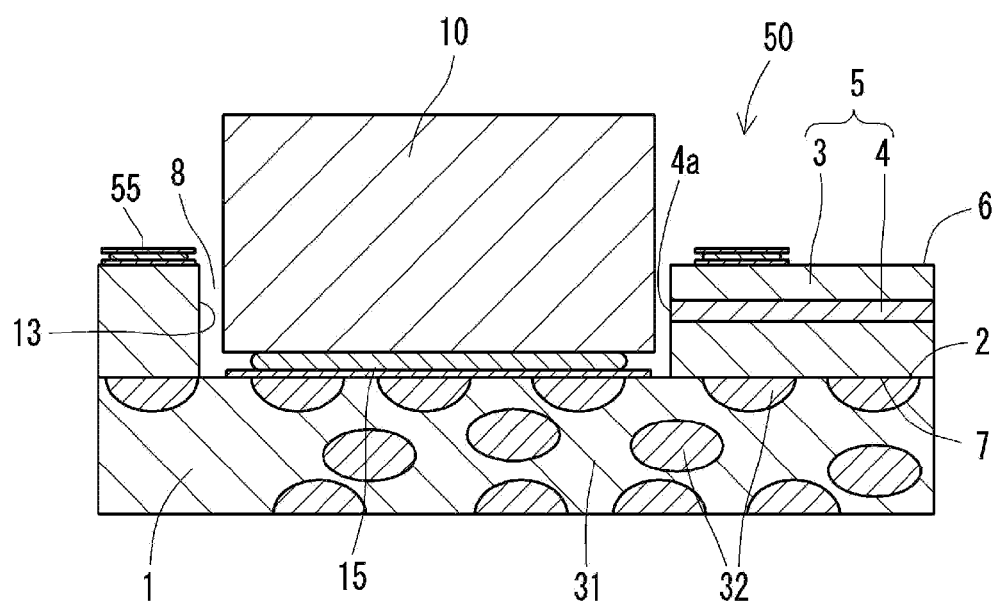
FIG. 6A is a partially enlarged cross-sectional view of a light-emitting device according to a second embodiment of the present disclosure, showing a part of a light-emitting element as viewed laterally.
Figure 6B:
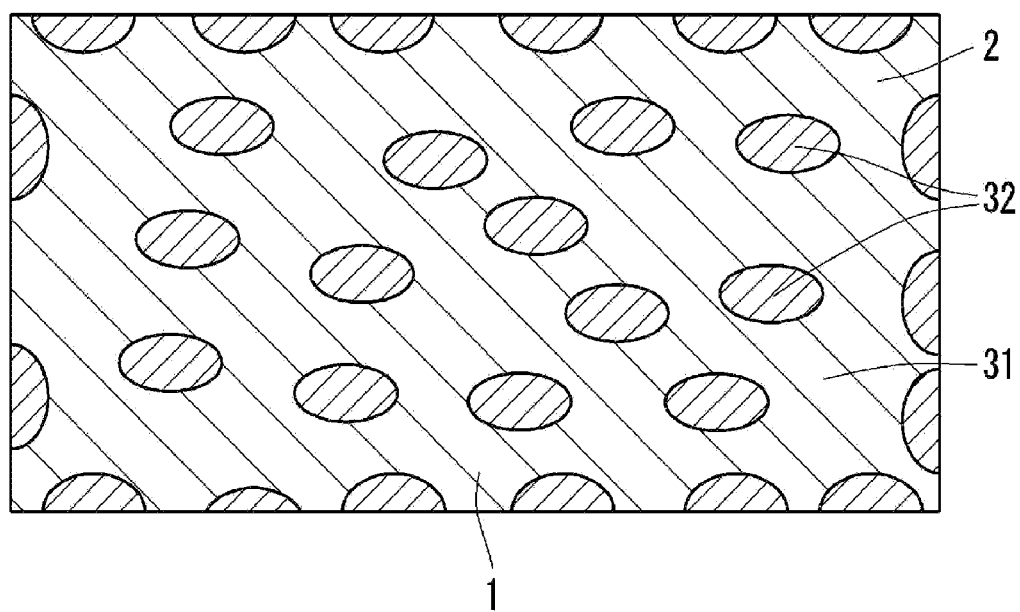
FIG. 6B is a partially enlarged plan view of the light-emitting device according to the second embodiment of the present disclosure, showing a part of the substrate as viewed from above.

FIGS. 6A and 6B are partially enlarged views of a light-emitting device according to a second embodiment of the present disclosure. FIG. 6A is a partial cross-sectional view of the light-emitting element as viewed laterally. FIG. 6B is a partial plan view of the substrate 1 as viewed from above. The components corresponding to those in the above embodiments are given the same reference numerals and will not be described repeatedly. The upper surface 2 of the substrate 1 is a mirror plane finished by polishing or another process. Such polishing improves the flatness of the surface of the substrate 1 to be the interface with the optical waveguide layer 5. The optical waveguide layer 5 formed on the surface is thus flatter to propagate light more efficiently. The mirror-finished upper surface 2 of the substrate 1 can reduce light leakage caused by reflection. Such light leakage is reduced more effectively in the substrate 1 that uses a base material with higher reflectivity. A mirror plane is a metal surface or a coated surface finished like a mirror to reflect images.

Third Embodiment

Figure 7A:
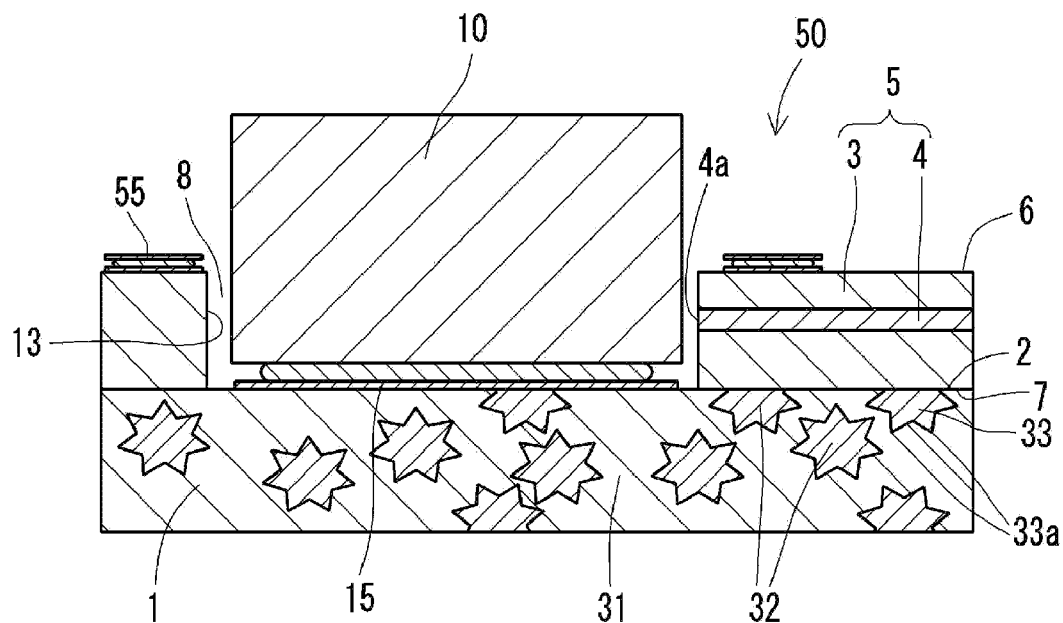
FIG. 7A is a partially enlarged cross-sectional view of a light-emitting device according to a third embodiment of the present disclosure, showing a part of a light-emitting element as viewed laterally.
Figure 7B:
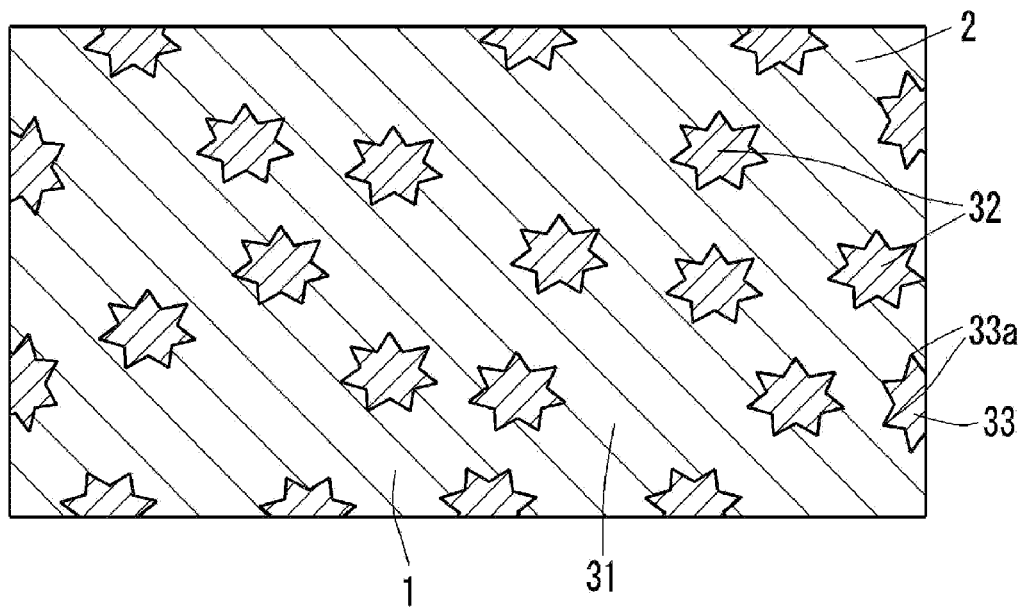
FIG. 7B is a partially enlarged plan view of the light-emitting device according to the third embodiment of the present disclosure, showing a part of the substrate as viewed from above.

FIGS. 7A and 7B are partially enlarged views of a light-emitting device according to a third embodiment of the present disclosure. FIG. 7A is a partial cross-sectional view of the light-emitting element as viewed laterally. FIG. 7B is a partial plan view of the substrate 1 as viewed from above. The components corresponding to those in the above embodiments are given the same reference numerals and will not be described repeatedly. The second portion 32 includes particulate pieces 33 each including a main portion and protrusions 33a protruding continuously from the main portion. The particulate pieces 33 are dispersed in the first portion 31. The main portion of each particulate piece 33 may be in the shape of a cylinder, a cone, a conical frustum, a prism, a pyramid, a pyramidal frustum, a sphere, or an ellipsoid. The protrusions 33a of each particulate piece 33 refer to a set of smaller particles connected together and protruding from the surface of the main portion. With the second portion 32 including the particulate pieces 33 each having the protrusions 33a, the second portion 32 may bond to another second portion 32 more strongly, and the first portion 31 may bond to the second portion 32 more strongly. This structure is less likely to have lower thermal conductivity caused by, for example, separation due to thermal expansion. Each protrusion 33a may have a curvature radius of about 0.01 to 5 μm and may be in the shape of a cylinder, a cone, a conical frustum, a prism, a pyramid, a pyramidal frustum, a sphere, or an ellipsoid.

Fourth Embodiment

Figure 8A:
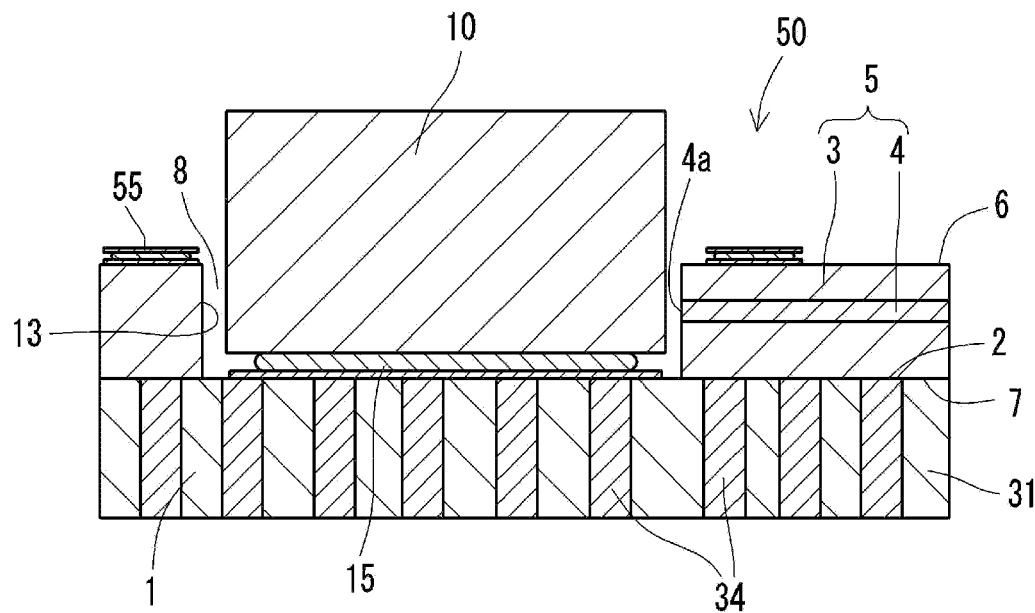
FIG. 8A is a partially enlarged cross-sectional view of a light-emitting device according to a fourth embodiment of the present disclosure, showing a part of a light-emitting element as viewed laterally.
Figure 8B:
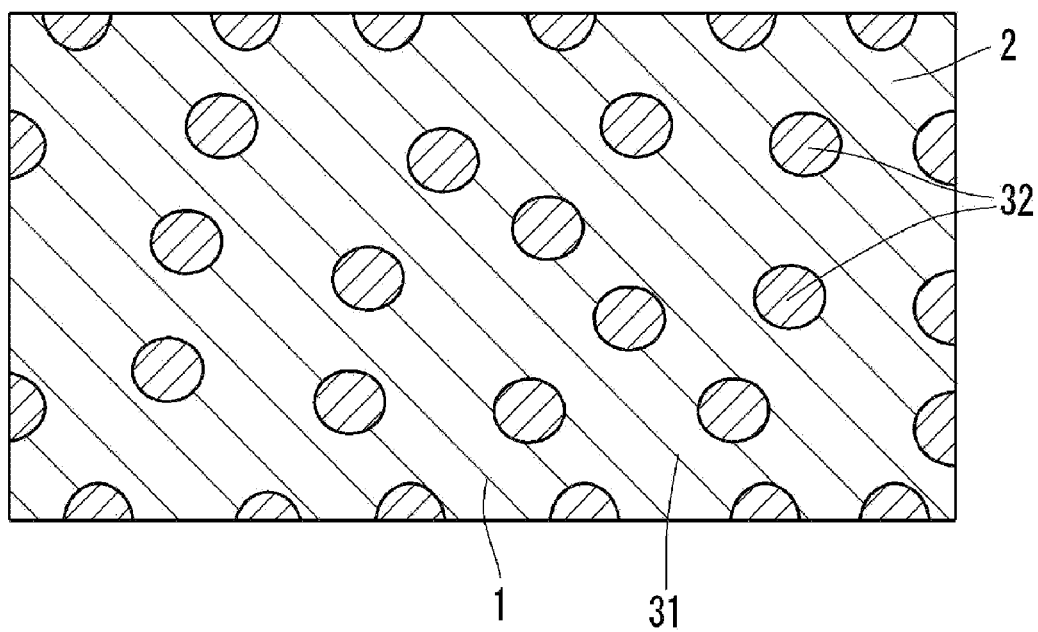
FIG. 8B is a partially enlarged plan view of the light-emitting device according to the fourth embodiment of the present disclosure, showing a part of the substrate as viewed from above.

FIGS. 8A and 8B are partially enlarged views of a light-emitting device according to a fourth embodiment of the present disclosure. FIG. 8A is a partial cross-sectional view of the light-emitting element as viewed laterally. FIG. 8B is a partial plan view of the substrate 1 as viewed from above. The components corresponding to those in the above embodiments are given the same reference numerals and will not be described repeatedly. The second portion 32 includes multiple pillar pieces 34 extending in a thickness direction of the substrate 1. The second portion 32 including such pillar pieces 34 may have a larger area of adhesion to the first portion 31. Thus, the optical waveguide layer 5, a wiring layer such as electrodes, and the entire substrate 1 may bond to one another more strongly. In this structure, heat passes through fewer interfaces from the optical waveguide layer 5 or the wiring layer such as electrodes to the back surface of the substrate 1. This structure thus allows more efficient heat dissipation. A pillar piece may be in the shape of a circle or a rectangle in a plan view, have a thickness in the thickness direction of the substrate 1, and be in the shape of a cylinder or a prism.

Fifth Embodiment

Figure 9A:
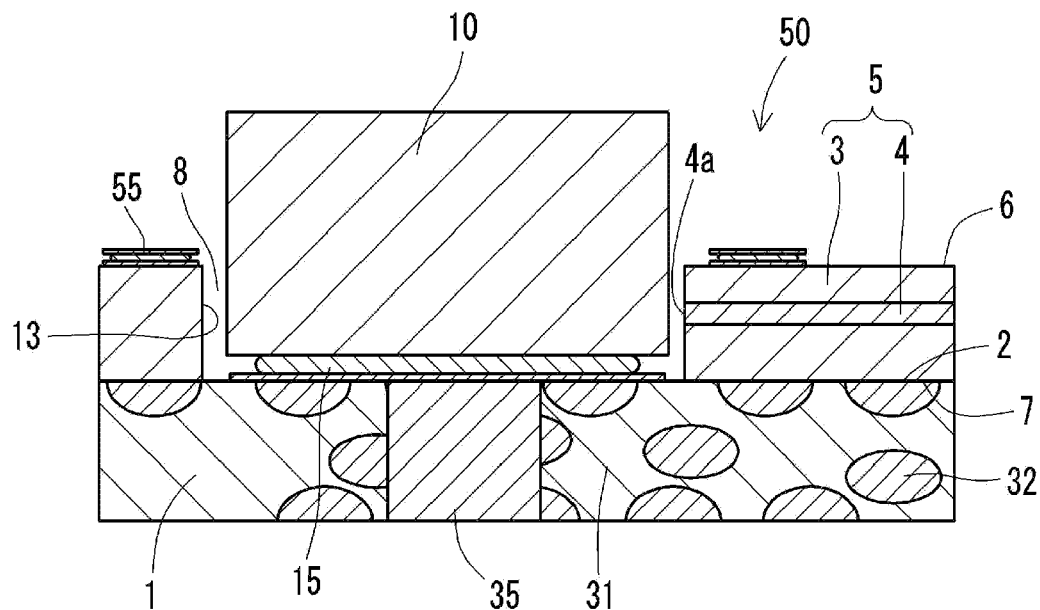
FIG. 9A is a partially enlarged cross-sectional view of a light-emitting device according to a fifth embodiment of the present disclosure, showing a part of a light-emitting element as viewed laterally.
Figure 9B:
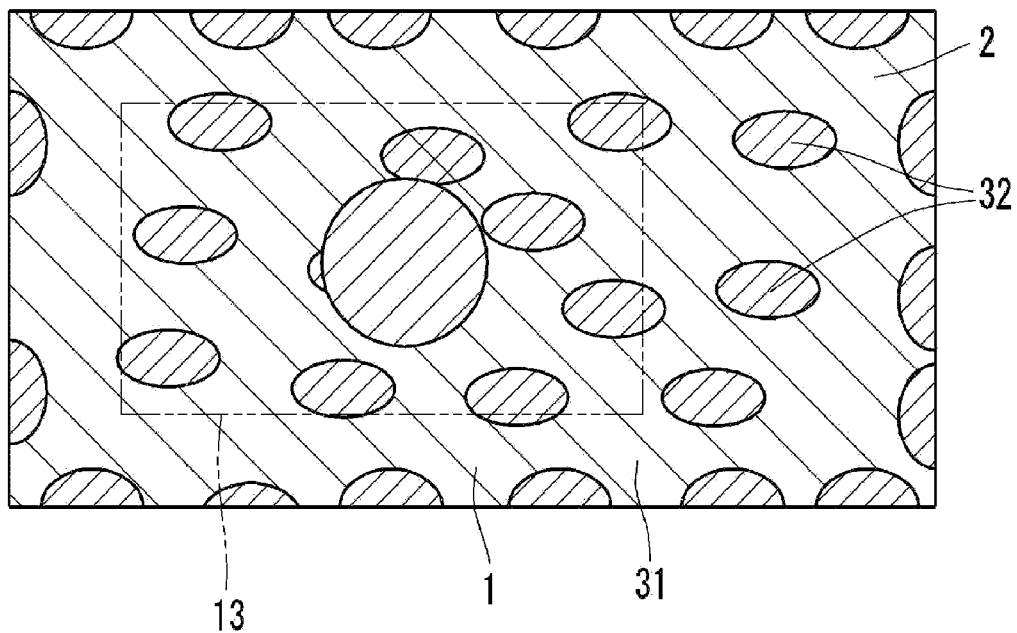
FIG. 9B is a partially enlarged plan view of the light-emitting device according to the fifth embodiment of the present disclosure, showing a part of the substrate as viewed from above.

FIGS. 9A and 9B are partially enlarged views of a light-emitting device according to a fifth embodiment of the present disclosure. FIG. 9A is a partial cross-sectional view of the light-emitting element as viewed laterally. FIG. 9B is a partial plan view of the substrate 1 as viewed from above. The components corresponding to those in the above embodiments are given the same reference numerals and will not be described repeatedly. The optical waveguide package 50 according to the present embodiment includes a cylindrical heat sink 35. The heat sink 35 is at least partially located in the substrate 1. The heat sink 35 has an end face exposed at the bottom surface of the recess 8. The heat sink 35 is formed from a material with higher thermal conductivity than the first portion 31, such as an Al alloy or a Cu alloy. The heat sink 35 with higher thermal conductivity than the substrate 1 is embedded in the substrate 1 immediately below the light-emitting element 10 to allow heat emitted from the light-emitting element 10 to dissipate efficiently. The second portion 32, which is a more strongly-bonded layer, is distributed adjacent to the side surface of the heat sink 35. This allows an electrode 15 on which the light-emitting element 10 is mounted to bond to the substrate 1 more strongly. The heat sink 35 may be in contact with at least a part of the second portion 32 to further improve heat dissipation and bonding performance. The thermal conductivity may be measured and evaluated with the hot-disk method, the probe method, the heat flow method, or the laser flash method in accordance with relevant standards.

Sixth Embodiment

Figure 10A:
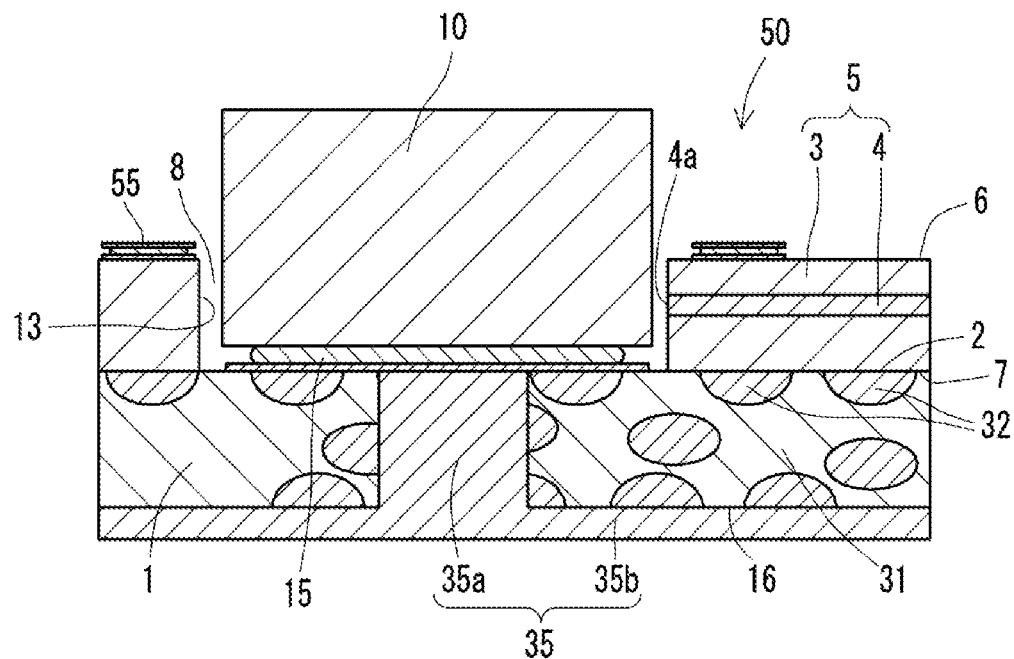
FIG. 10A is a partially enlarged cross-sectional view of a light-emitting device according to a sixth embodiment of the present disclosure, showing a part of a light-emitting element as viewed laterally.
Figure 10B:
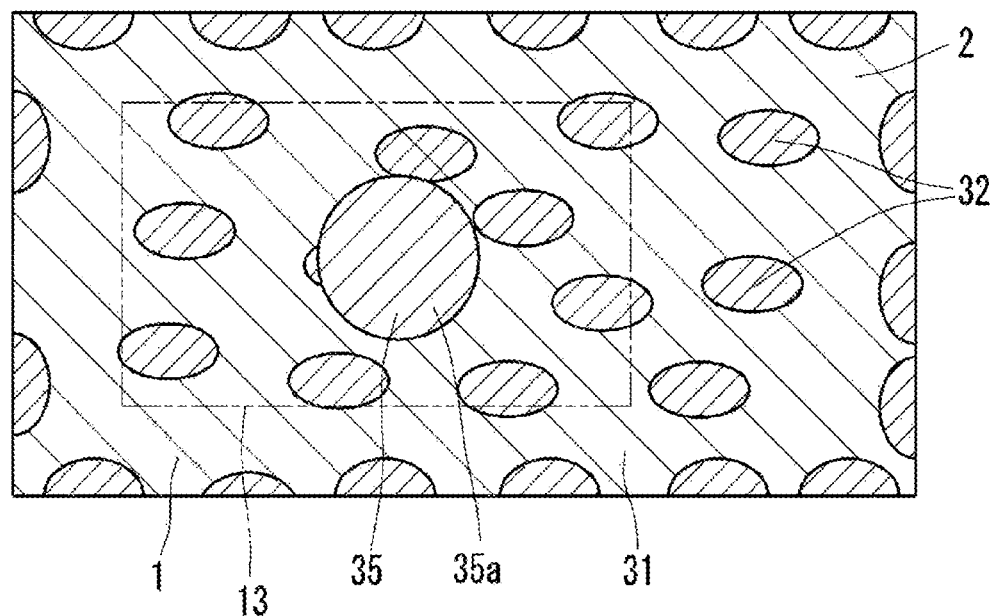
FIG. 10B is a partially enlarged plan view of the light-emitting device according to the sixth embodiment of the present disclosure, showing a part of the substrate as viewed from above.

FIGS. 10A and 10B are partially enlarged views of a light-emitting device according to a sixth embodiment of the present disclosure. FIG. 10A is a partial cross-sectional view of the light-emitting element as viewed laterally. FIG. 10B is a partial plan view of the substrate 1 as viewed from above. The components corresponding to those in the above embodiments are given the same reference numerals and will not be described repeatedly. The substrate 1 includes a lower surface 16 opposite to the upper surface 2. The heat sink 35 includes an embedded portion 35*a* and a plate portion 35*b*. The embedded portion 35*a* exposed at the bottom surface of the recess 8 extends from the bottom surface of the recess 8 to the lower surface 16. The plate portion 35*b* is connected to the embedded portion 35*a* and is located on the lower surface 16. The plate portion 35*b* is formed as another bonding layer on the lower surface 16 of the substrate 1 and is joined to the electrode 15 with the embedded portion 35*a*. This allows the electrode 15 and the entire substrate 1 to bond to each other more strongly.

Seventh Embodiment

Figure 11A:
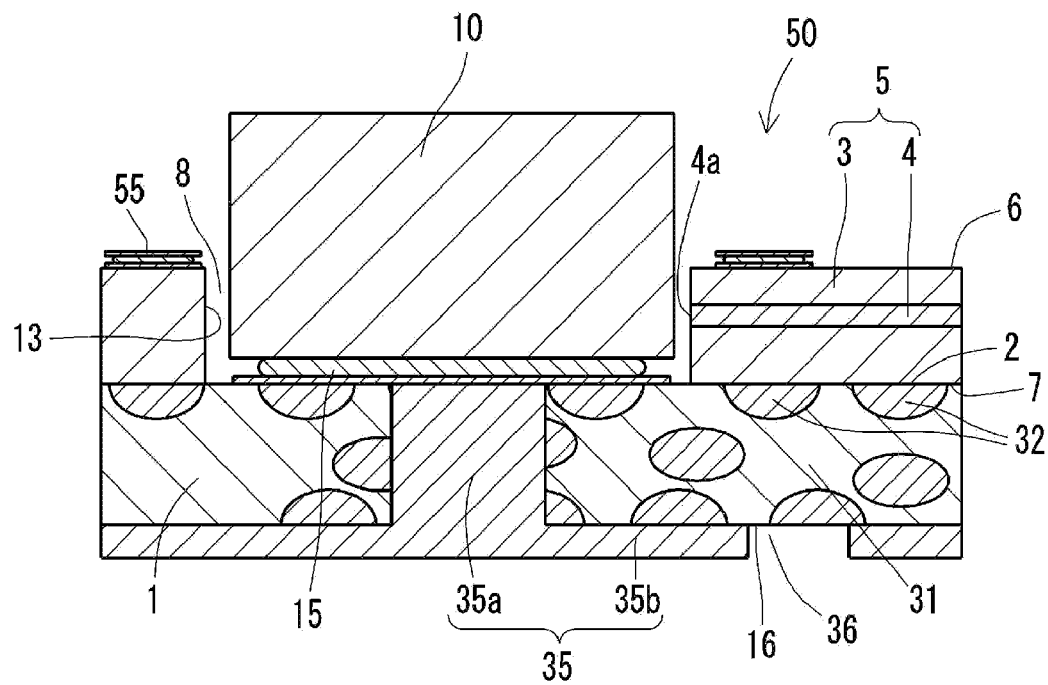
FIG. 11A is a partially enlarged cross-sectional view of a light-emitting device according to a seventh embodiment of the present disclosure, showing a part of a light-emitting element as viewed laterally.
Figure 11B:
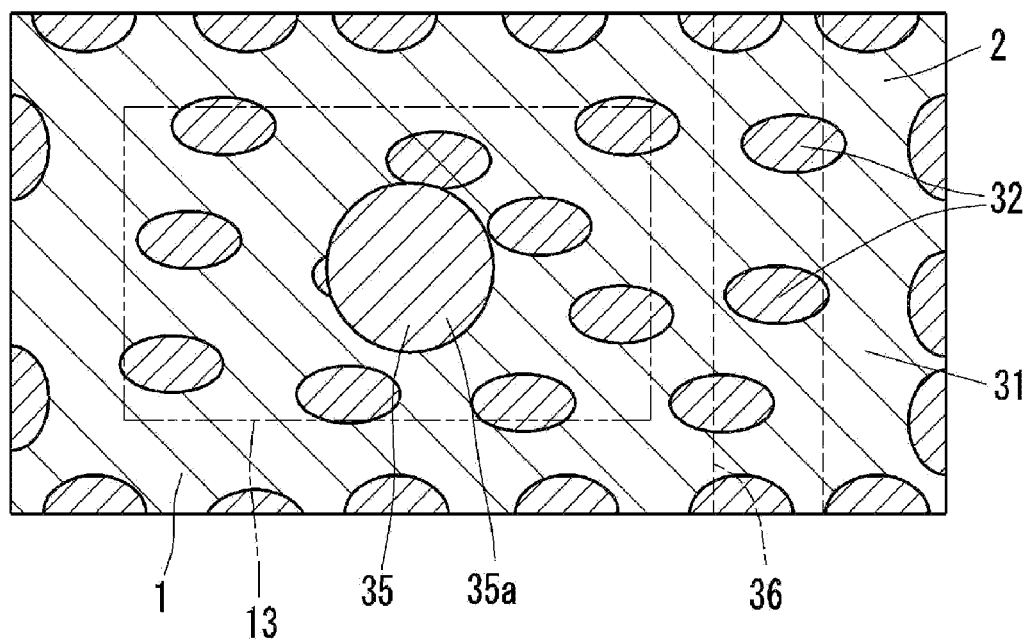
FIG. 11B is a partially enlarged plan view of the light-emitting device according to the seventh embodiment of the present disclosure, showing a part of the substrate as viewed from above.

FIGS. 11A and 11B are partially enlarged views of a light-emitting device according to a seventh embodiment of the present disclosure. FIG. 11A is a partial cross-sectional view of the light-emitting element as viewed laterally. FIG. 11B is a partial plan view of the substrate 1 as viewed from above. The components corresponding to those in the above embodiments are given the same reference numerals and will not be described repeatedly. The optical waveguide package 50 according to the present embodiment includes a clearance 36 that divides the plate portion 35*b* on the lower surface 16 of the substrate 1. This may reduce thermal stress and breakage or light propagation loss in the substrate 1 due to deformation. When the substrate 1 is formed from an insulator and the heat sink 35 is formed from a metal material, electric power for operating the light-emitting element 10 may be supplied through the lower surface 16.

Eighth Embodiment

Figure 12A:
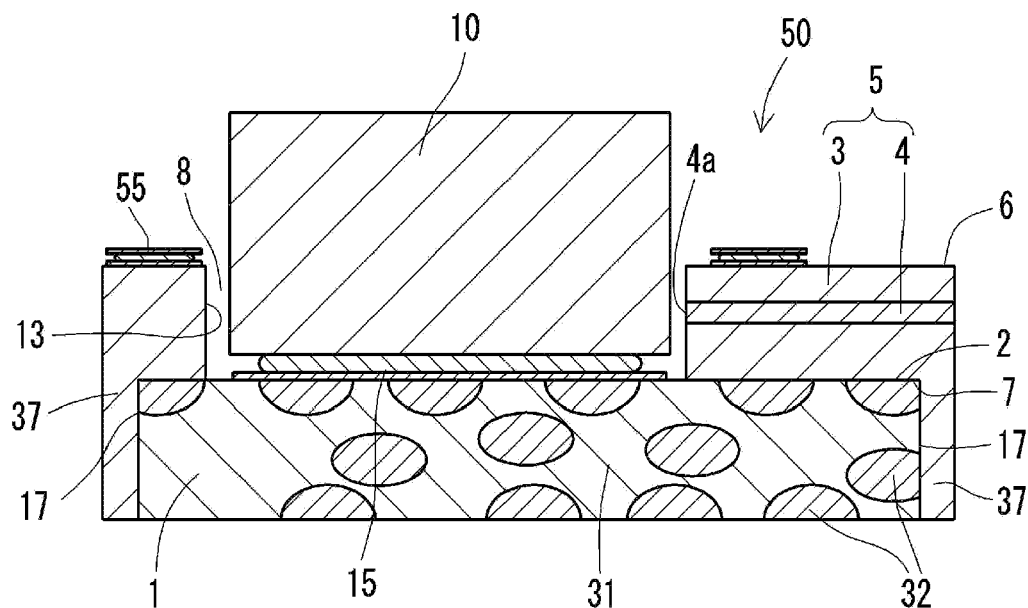
FIG. 12A is a partially enlarged cross-sectional view of a light-emitting device according to an eighth embodiment of the present disclosure, showing a part of a light-emitting element as viewed laterally.
Figure 12B:
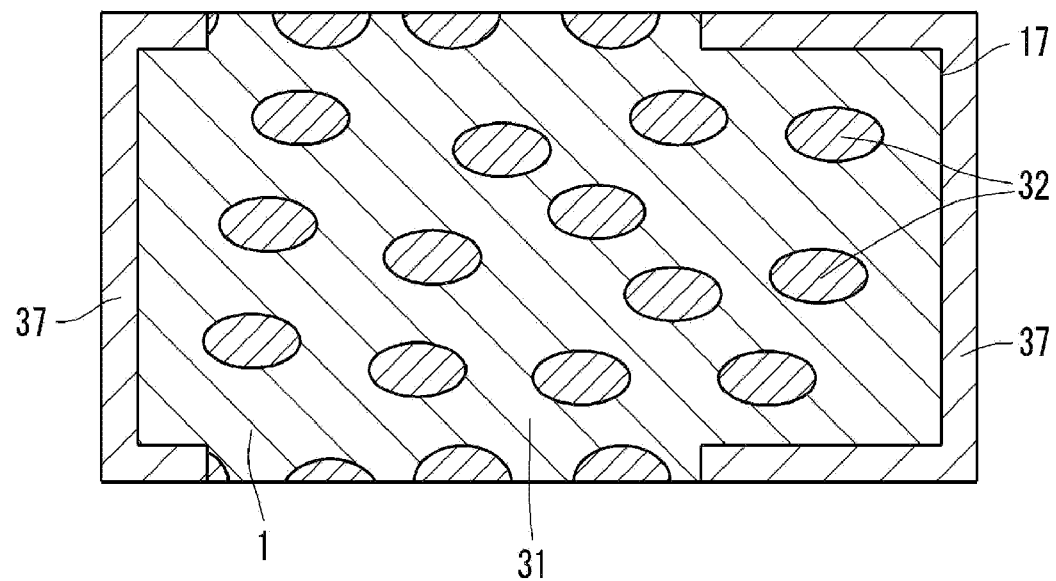
FIG. 12B is a partially enlarged plan view of the light-emitting device according to the eighth embodiment of the present disclosure, showing a part of the substrate as viewed from above.

FIGS. 12A and 12B are partially enlarged views of a light-emitting device according to an eighth embodiment of the present disclosure. FIG. 12A is a partial cross-sectional view of the light-emitting element as viewed laterally. FIG. 12B is a partial plan view of the substrate 1 as viewed from above. The components corresponding to those in the above embodiments are given the same reference numerals and will not be described repeatedly. The substrate 1 has side surfaces 17 connected to the upper surface 2. The cladding 3 further includes a cover 37 located on the side surfaces 17. The cover 37 allows the cladding 3 in the optical waveguide layer 5 to extend over the side surfaces 17 of the substrate 1, thus allowing the optical waveguide layer 5 to bond to the substrate 1 more strongly.

Ninth Embodiment

Figure 13A:
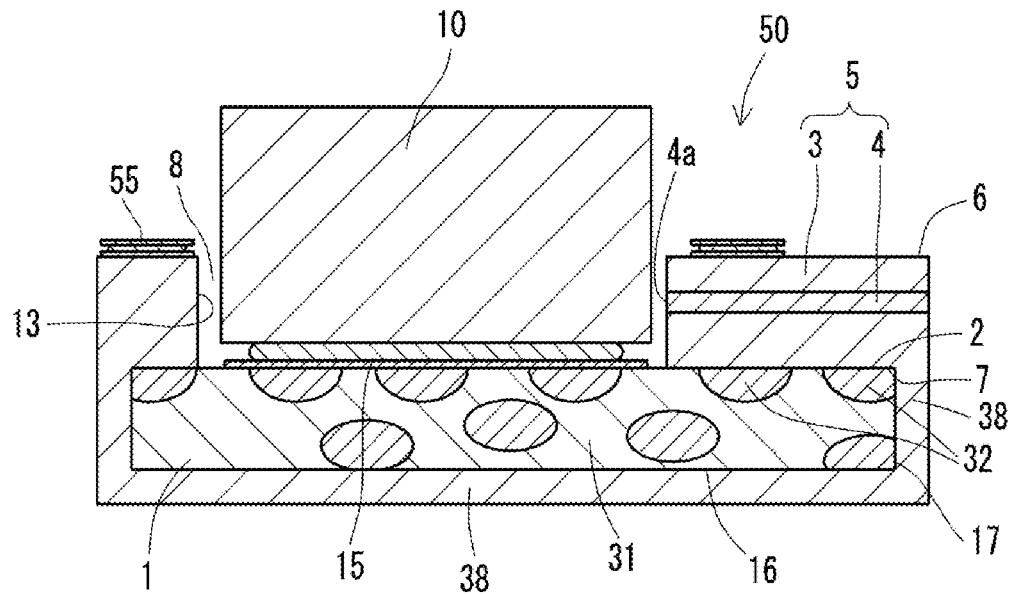
FIG. 13A is a partially enlarged cross-sectional view of a light-emitting device according to a ninth embodiment of the present disclosure, showing a part of a light-emitting element as viewed laterally.
Figure 13B:
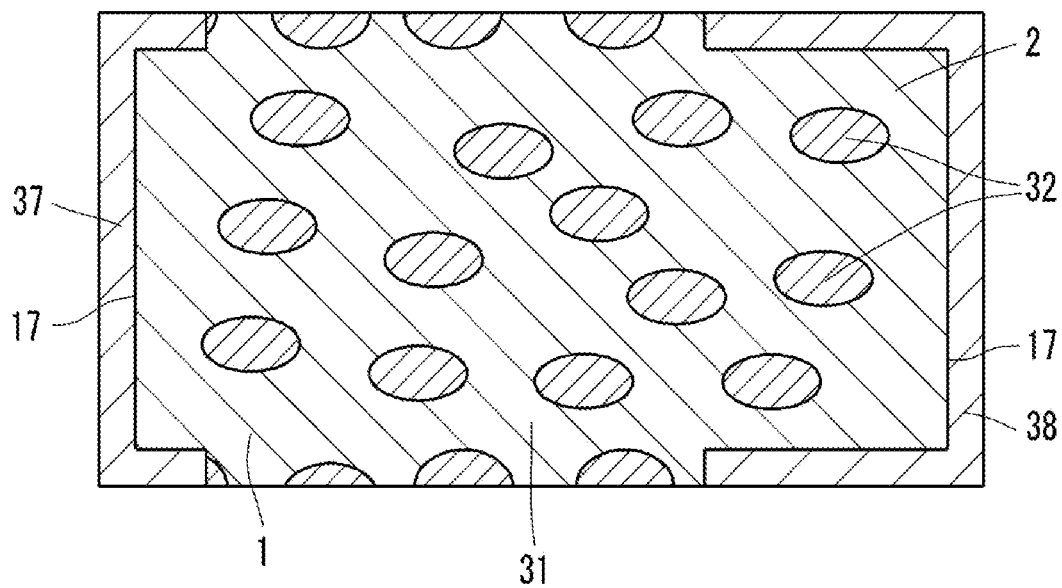
FIG. 13B is a partially enlarged plan view of the light-emitting device according to the ninth embodiment of the present disclosure, showing a part of the substrate as viewed from above.

FIGS. 13A and 13B are partially enlarged views of a light-emitting device according to a ninth embodiment of the present disclosure. FIG. 13A is a partial cross-sectional view of the light-emitting element as viewed laterally. FIG. 13B is a partial plan view of the substrate 1 as viewed from above. The components corresponding to those in the above embodiments are given the same reference numerals and will not be described repeatedly. The substrate 1 includes the lower surface 16 opposite to the upper surface 2 and the side surfaces 17 connecting the upper surface 2 and the lower surface 16. The cladding 3 includes a cover 38 located on the side surfaces 17 and the lower surface 16, and the cover 38 covers the side surfaces 17 and the lower surface 16. The cover 38 allows the cladding 3 in the optical waveguide layer 5 to extend over the side surfaces 17 and the lower surface 16 of the substrate 1, thus allowing the optical waveguide layer 5 to bond to the substrate 1 more strongly.

In still another embodiment of the present disclosure, the light-emitting elements 10 are not limited to light-emitting diodes (LEDs) but may be, for example, laser diodes (LDs) or vertical-cavity surface-emitting lasers (VCSELs).

As described above, the optical waveguide package according to one or more embodiments of the present disclosure includes the substrate and the optical waveguide layer. The substrate includes the first portion and the second portion that are exposed at least at the upper surface of the substrate. The second portion bonds to the cladding with a higher bonding strength than the first portion. The light-emitting device according to one or more embodiments of the present disclosure includes the optical waveguide package and the light-emitting element accommodated in the recess in the optical waveguide package.

In the optical waveguide package and the light-emitting device according to one or more embodiments of the present disclosure, the substrate includes the first portion and the second portion. The first portion reduces thermal stress caused by heat emitted from the light-emitting element, and the second portion increases the bonding strength. The substrate thus receives less thermal stress and is less likely to be separated from the optical waveguide layer.

Although embodiments of the present disclosure have been described in detail, the present disclosure is not limited to the embodiments described above, and may be changed or modified in various manners without departing from the spirit and scope of the present disclosure. The components described in the above embodiments may be entirely or partially combined as appropriate unless any contradiction arises.

REFERENCE SIGNS LIST 1 substrate
2 upper surface
3 cladding
4 core
4*a*, 4*b*, 4*c* incident end face
5 optical waveguide layer
6 upper surface
7 lower surface
8 recess
11 sealing lid
11*a* lower surface of sealing lid 11
13 inner wall surface 15 electrode
16 lower surface
17 side surface
10 light-emitting element
20 light-emitting device
31 first portion
32 second portion
33 particulate piece
33a protrusion
34 pillar piece
35 heat sink
35a embedded portion
35b plate portion
36 clearance
37, 38 cover
41a, 41b, 41c branching path
42 emission end face
43 merging portion
44 joined path
45 condenser lens
50 optical waveguide package
55 bonding layer

The invention claimed is:

1. An optical waveguide package, comprising:
a substrate having a first surface; and
an optical waveguide layer including a cladding located on the first surface and a core located in the cladding,
wherein the substrate includes a first portion and a second portion being in contact with the cladding;
the second portion including a plurality of particulate pieces which dispersed in the first portion; and
an adhesion strength of the second portion to the cladding is higher than an adhesion strength of the first portion to the cladding;
wherein at least some of the plurality of particulate pieces have protrusions with a curvature radius of 0.01 μm to 5 μm.

2. The optical waveguide package according to claim 1, wherein the first surface includes a mirror plane.

3. The optical waveguide package according to claim 1, wherein
the second portion includes pillar pieces extending in a thickness direction of the substrate.

4. The optical waveguide package according to claim 1, further comprising:
a heat sink at least partially located in the substrate,
wherein the cladding further includes a recess, and the heat sink is exposed at a bottom surface of the recess, and
the heat sink has higher heat conductivity than the first portion.

5. The optical waveguide package according to claim 4, wherein
the substrate further has a second surface opposite to the first surface, and
the heat sink includes an embedded portion and a plate portion, the embedded portion is exposed at the bottom surface of the recess and extends from the bottom surface of the recess to the second surface, and the plate portion is located on the second surface.

6. The optical waveguide package according to claim 1, wherein
the substrate further has a side surface connected to the first surface, and
the cladding further includes a portion located on the side surface.

7. The optical waveguide package according to claim 1, wherein
the substrate further has a lower surface opposite to the first surface and a side surface connecting the first surface and the lower surface, and
the cladding further includes a portion located on the side surface and the lower surface.

8. A light-emitting device, comprising:
the optical waveguide package according to claim 1; and
at least one light-emitting element connected to the optical waveguide package.

9. The light-emitting device according to claim 8, wherein
the cladding has a recess,
the light-emitting element includes three light-emitting elements configured to emit red light, green light, and blue light respectively, and
the three light-emitting elements are accommodated in the recess.

10. The optical waveguide package according to claim 1, wherein the protrusions are in a shape of a cylinder, a cone, a conical frustum, a prism, a pyramid, a pyramidal frustum, a sphere, or an ellipsoid.

* * * * *